United States Patent [19]

McAvoy

[11] 4,099,147
[45] Jul. 4, 1978

[54] BULK ACOUSTIC DELAY DEVICE

[75] Inventor: Bruce R. McAvoy, Pittsburgh, Pa.

[73] Assignee: Westinghouse Electric Corp., Pittsburgh, Pa.

[21] Appl. No.: 792,835

[22] Filed: May 2, 1977

[51] Int. Cl.² .................. H03H 9/26; H03H 9/30; H01L 41/04
[52] U.S. Cl. ............................. 333/30 R; 310/366; 333/72
[58] Field of Search ............... 333/30 R, 30 M, 72, 333/71; 310/365, 366, 311, 328, 333, 367

[56] References Cited
U.S. PATENT DOCUMENTS 3,582,834  6/1971  Evans ............................ 333/30 R
3,942,139  3/1976  Cooper et al. .................. 333/30 R Primary Examiner—Davis L. Willis
Assistant Examiner—Marvin Nussbaum
Attorney, Agent, or Firm—R. M. Trepp

[57] ABSTRACT

A bulk acoustic delay device incorporating a transmitting transducer, a substrate, and two receiving transducers is described which may reduce the amplitude of undesired received reflected bulk acoustic waves by positioning one of the two receiving transducers to receive only the reflected wave having a longer acoustic path length due to wave diffraction to provide an output signal having a normal delayed signal and an attenuated triple or quadruple transit echo signal due to destructive interference. An alternate embodiment utilizes one composite receiving transducer.

6 Claims, 18 Drawing Figures

4.4 GHZ

3.9 GHZ

BULK ACOUSTIC DELAY DEVICE

BACKGROUND OF THE INVENTION

1. Field of the Invention

This invention relates to electroacoustic apparatus, particularly to bulk mode acoustic delay devices.

2. DESCRIPTION OF THE PRIOR ART

In the prior art a broad band delay device or delay line was made from either coiled lengths of coaxial cable or waveguides where the length of the cable or waveguide determine the time delay. The delay device could, for example, delay a radar signal for a specific period of time such as 100 nanoseconds which is normally used in conjunction with other signal processing circuitry. Delay devices made from coaxial cable or waveguides are considered to be large and heavy when used in airborne applications. An example of a broad band delay device which overcomes these objections for airborne use is described in U.S. Pat. No. 3,942,139 issued on Mar. 2, 1976 entitled "Broad Band Microwave Bulk Acoustic Delay Device" by H. W. Cooper and J. de Klerk and assigned to the assignee herein. In U.S. Pat. No. 3,942,139 a transducer generates bulk mode acoustic waves towards a second surface which reflects the waves back towards the first-mentioned transducer and a receiving transducer located nearby. The acoustic wave is reflected off the surface supporting the transducers back towards the reflecting surface whereupon the wave is reflected back to the receiving transducer. The second wave to be reflected off the reflecting surface is known as the triple transit signal or echo and is undesired. In another arrangement of transducers a quadruple transit signal occurs which is undesired. Subsequent undesired echoes are also observed but are somewhat reduced due to the effects of the attenuation in the acoustic material, for example, 3 dB per centimeter at 4 GHz for sapphire and by diffraction of the acoustic wave as it continues to spread laterally as it propagates through the transmission medium. In addition, the echoes may be partially absorbed by covering the surfaces of the delay device with a film of silver-indium to absorb unwanted unwanted acoustic waves. In certain applications, additional attenuation of the triple or quadruple transit signal is desired.

It is therefore desirable to provide additional techniques for improving the attenuation of triple or quadruple transit signal in a delay device using bulk acoustic waves and destructive interference in a low loss transmission medium such as sapphire, titanium dioxide, or lithium niobate.

Furthermore, it is desirable that additional attenuation techniques be provided for reducing the triple or quadruple transit signal which are applicable over a broad frequency range.

SUMMARY OF THE INVENTION

In accordance with the present invention electroacoustic apparatus is provided for delaying signals comprising a substrate having an upper and lower surface, the substrate comprised of materials suitable for propagating bulk acoustic waves, a first transducer mounted on the upper surface for generating bulk acoustic waves toward the lower surface, the first transducer electrode dimensions being of such size to provide a predetermined diffraction in the bulk acoustic waves, the lower surface being planar and positioned to reflect ultrasonic elastic wave energy incident upon the lower surface, means for coupling an input signal to the first transducer, a second transducer mounted on the upper surface and positioned for receiving bulk acoustic waves reflected from the lower surface and having a first acoustic path length from the first transducer to the second transducer for a bulk acoustic wave reflected twice from the lower surface, a third transducer mounted on the upper surface and positioned for receiving only bulk acoustic waves reflected two or more times from the lower surface and spaced from the first transducer to provide a second acoustical path length from the first transducer to the third transducer for a bulk acoustic wave reflected twice from the lower surface, the first and second acoustical path lengths being different to provide a phase difference of the bulk acoustic wave reflected two times from the lower surface and received at the second and third transducer, and means for electrically coupling the second and third transducers to provide an output signal having a double transit response and an attenuated quadruple transit response due to the phase difference of the received bulk acoustic wave. Alternate configurations are provided where the second and third transducer are mounted on the lower surface. Another alternate configuration provides for one composite transducer on the lower surface in place of the second and third transducers wherein first selected areas are positioned to receive direct and reflected bulk acoustic waves and second selected areas are positioned to receive only reflected bulk acoustic waves.

DESCRIPTION OF THE PREFERRED EMBODIMENTS

Figure 1:
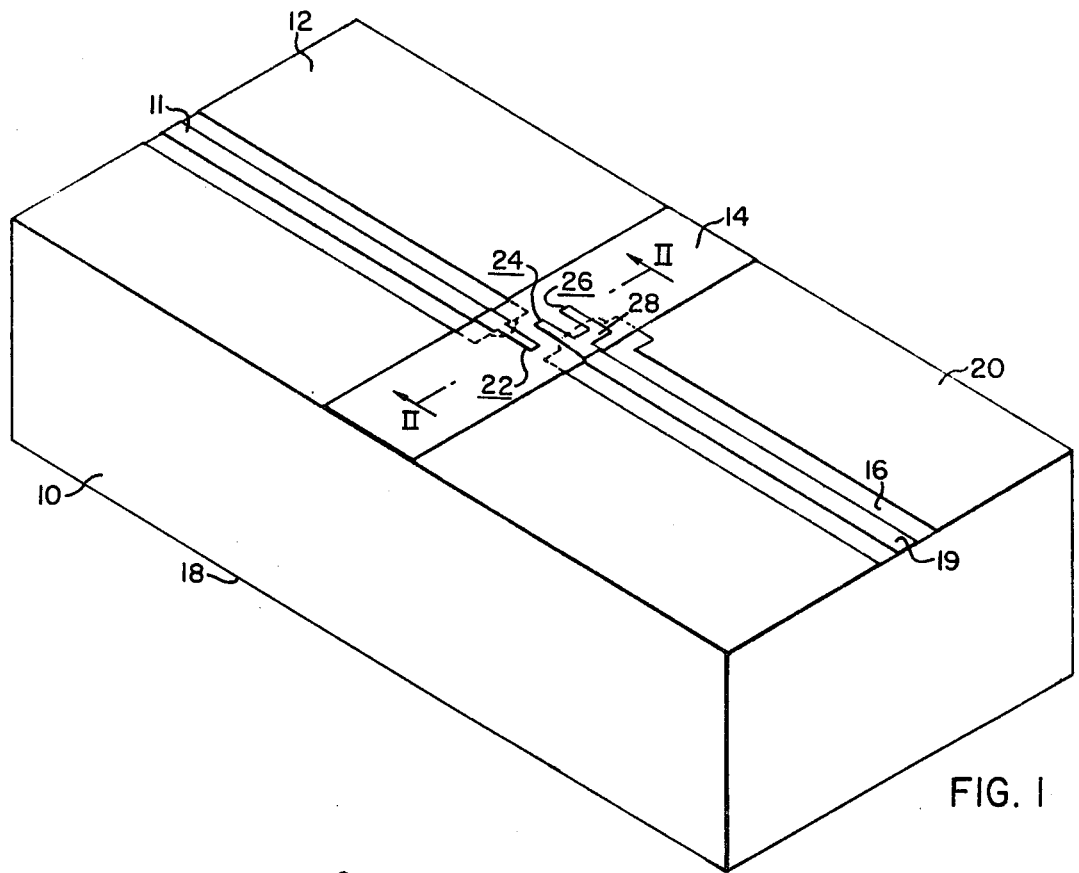
FIG. 1 is an isometric view of an embodiment of the invention.

Referring now to the drawings, in FIG. 1 a substrate 10 is shown having an upper surface 16 and a lower surface 18. Substrate 10 is comprised of material suitable for propagating bulk acoustic waves. By way of example, materials that would be suitable for substrate 10 are materials that are piezoelectric, non-piezoelectric, insulating, semiconductor and conducting. The upper surface 16 may be planar suitable for subsequent photolithic steps for fabricating the electrode patterns of the transducers. The lower surface 18 may be planar with all or a portion of the lower surface 18 suitable for reflecting ultrasonic elastic wave energy.

A first transducer 22 is mounted on upper surface 16 for generating bulk acoustic waves toward the lower surface 18 of substrate 10. The first transducer 22 may, for example, be suitable for operation in the frequency range from 2.6 GHz to 6 GHz and may be fabricated using vapor deposition techniques. For example, in fabricating a transducer an electrode 12 is deposited on the substrate 10 and a piezoelectric material 14, such as zinc oxide or cadmium sulphide or other suitable transducer material, may be vacuum deposited over electrode 12. The piezoelectric material may be deposited to a thickness of about one-third to one-half wavelength of the mid-band frequency of the transducer. An electrode 11 is deposited over the piezoelectric material 14 and over electrode 12 in the area where transducer action is desired. The electrode area of the transducer corresponds to the aperture from which ultrasonic waves propagate into the substrate 10. The method of depositing piezoelectric transducers may be found in U.S. Pat. No. 3,655,429 issued on Apr. 11, 1972 to John de Klerk and assigned to the present assignee.

The dimensions of the first transducer 22 are chosen to provide a predetermined defraction in the bulk acoustic waves generated by the first transducer. The bulk acoustic waves travel from the first transducer 22 into substrate 10 and towards the lower surface 18. Lower surface 18 is planar and positioned to reflect the bulk acoustic waves back toward the upper surface 16. Electrodes 11 and 12 provide a means for coupling an input signal to the first transducer 22. A second transducer 24 is mounted on the upper surface 16 and positioned for receiving bulk acoutic waves reflected from the lower surface 18. The bulk acoustic wave should defract or spread by the time it reaches the upper surface 16 from the lower surface 18 to impinge on an area which would include the second transducer 24. The distance that the bulk acoustic wave travels from the first transducer 22 to the second transducer 24 is the path length for the bulk acoustic wave. The bulk acoustic wave incident on the upper surface 16 is reflected back towards the lower surface 18 whereupon it is reflected back towards the upper surface 16. The distance that the bulk acoustic wave travels from the first transducer 22 to the second transducer 24 with two reflections off the lower surface 18 is the path length for the quadruple transit time. The bulk acoustic wave traverses substrate 10 four times. The time required for the bulk acoustic wave to traverse the substrate 10 four times to a respective transducer is known as a quadruple transit time. The first acoustical path length is designated as the path taken by a bulk acoustic wave from the first transducer 22 to the second transducer 24 for a bulk acoustic wave traversing the substrate 10 four times and reflected twice from the lower surface 18. A third transducer 26 is mounted on the upper surface 16 and positioned for receiving only bulk acoustic waves reflected two or more times from the lower surface 18. In other words, the third transducer 26 is positioned outside of the area incident by the first reflected bulk acoustic wave generated by the first transducer 22. When the bulk acoustic wave has traversed substrate 10 four times and is reflected twice from the lower surface 18, it impinges on the third transducer 26. The distance traveled by the bulk acoustic to traverse the substrate four times and reach third transducer 26 is designated as the second acoustical path length. The second acoustical path length may be varied by spacing the third transducer at a fixed distance from the first transducer to require the bulk acoustic wave to travel laterally, diffract or spread as it traverses substrate 10 four times. By varying the position of the second transducer 24 and the third transducer 26 the first and second acoustical path lengths may be different such as one-half wavelength at a preferred frequency to provide a phase difference of the bulk acoustic wave reflected two times from the lower surface 18 and received at the second transducer 24 and the third transducer 26. The phase difference in the bulk acoustic wave results in destructive interference of the signals received at transducers 24 and 26. Electrode 28 electrically couples transducer 24 to transducer 26 to provide an output signal. The output signal may be coupled off the substrate by means of electrode 19 and electrode 20 which function as a transmission line having a predetermined impedance characteristic. If a pulse is transmitted by transducer 22, the output signal will have a double transit response and an attenuated quadruple transit response, the attenuation being due to the phase difference of the received bulk acoustic wave at transducers 24 and 26. Of course, the double transit response is received only by transducer 24 because transducer 26 is positioned outside of the area incident by the second transit bulk acoustic wave. The continuing diffraction in the bulk acoustic wave provides for a spreading of the areas incident upon the upper surface 16 by the reflected bulk acoustic waves. Thus, a double transit bulk acoustic wave would be incident upon the area where transducer 24 is located while not incident upon the area where transducer 26 is located. For the quadruple transit acoustic wave the area incident on the upper surface 16 includes both transducer 24 and transducer 26.

Figure 2A:
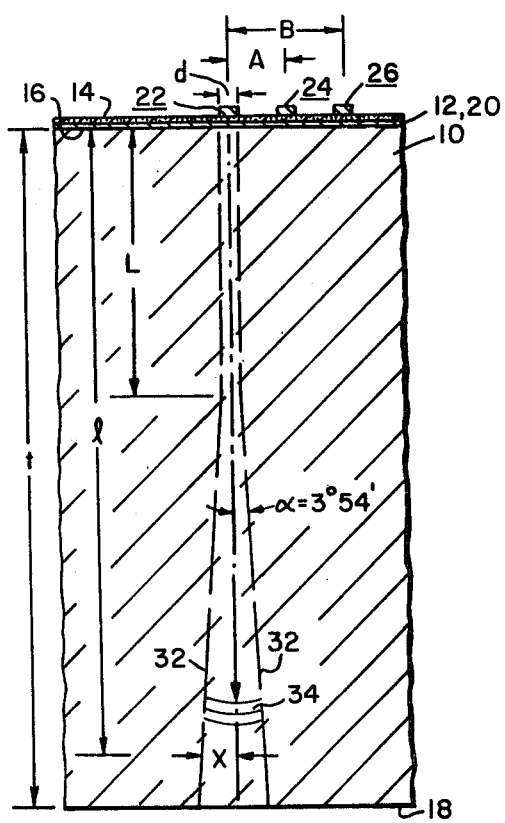
FIG. 2A through 2D are an enlarged sectional view of the apparatus taken along the lines II—II of FIG. 1 with additional lines to illustrate the path of an ultrasonic elastic wave from a transducer.

FIGS. 2A through 2D are an enlarged sectional view of the apparatus taken along lines II—II of FIG. 1. First transducer 22 is shown having a cross section width of dimension $d$ which is the width of one side of transducer 22. An ultrasonic elastic wave, upon entering substrate 10, exhibits characteristics as determined by the laws of physics wherein the initial path or distance is known as the Fresnel zone. In the Fresnel zone the ultrasonic elastic wave continues with approximately the same cross sectional area as the original aperture, dimension $d$. At the end of the Fresnel zone, the ultrasonic elastic wave begins to spread, forming a larger cross sectional area as it propagates through the substrate 10. The region where beam spreading begins and continues at a constant rate is called the Fraunhofer field region. The Fresnel zone extends from the transducer 22 approximately out to a distance $L$ where:

$$L = 2d^2/\lambda \tag{1}$$

where $d$, as stated before, is the width of one side of the transducer for rectangular transducer and $\lambda$ is the wavelength of the ultrasonic elastic wave in the transmission medium. $\lambda$ may be determined by the relationship;

$$\lambda = v/f \tag{2}$$

where $v$ is the velocity of the ultrasonic elastic wave in the transmission medium and $f$ is the frequency of the ultrasonic elastic wave. For silicon the velocity of ultrasonic elastic wave is $9 \times 10^5$ centimeters/seconds. The Fraunhofer field region is considered to begin where the Fresnel zone ends. The beam spreading of the ultrasonic elastic wave in the Fraunhofer field region is described by the angle $\alpha$ as shown in FIG. 2A and is defined by the relationship;

$$\alpha = \lambda/2d \tag{3}$$

The distance $x$ from the beam center out to the beam edge in the the Fraunhofer region is described by;

$$x = 1 \text{ tangent } \alpha \tag{4}$$

where $l$ is the distance from the transducer to the point of measurement in the Fraunhofer field region. The beam spreading in the Fraunhofer field region continues uniformly as the ultrasonic elastic wave or bulk acoustic wave travels or propagates through the substrate 10. A reflected ultrasonic elastic wave continues to spread uniformly at the same angle $\alpha$.

By way of example, typical parameters may be;

Frequency of input signal: 5.2 GHz
Transmission medium: Silicon
Wavelength in transmission medium: $1.73 \times 10^{-4}$ cm
$d$ of transducer 22: $1.27 \times 10^{-3}$ cm
Center-to-center distance between transducers 22 and 24: $4.6 \times 10^{-3}$ cm
Center-to-center distance between transducers 22 and 26: $10.58 \times 10^{-3}$ cm
Thickness of transmission medium: $4.5 \times 10^{-2}$ cm With these parameters for the configuration shown in FIGS. 2A through 2D the Fresnal zone ends at a distance L of approximately $1.86 \times 10^{-2}$ cm from the upper surface 16 and the beam spreading angle $\alpha$ is approximately 3° 54'. The width of the bulk acoustic wave reflected from the lower surface 18 and impinging upon the upper surface 16 from the center of transducer 22 outwards is $12.26 \times 10^{-3}$ cm.

Figure 2B:
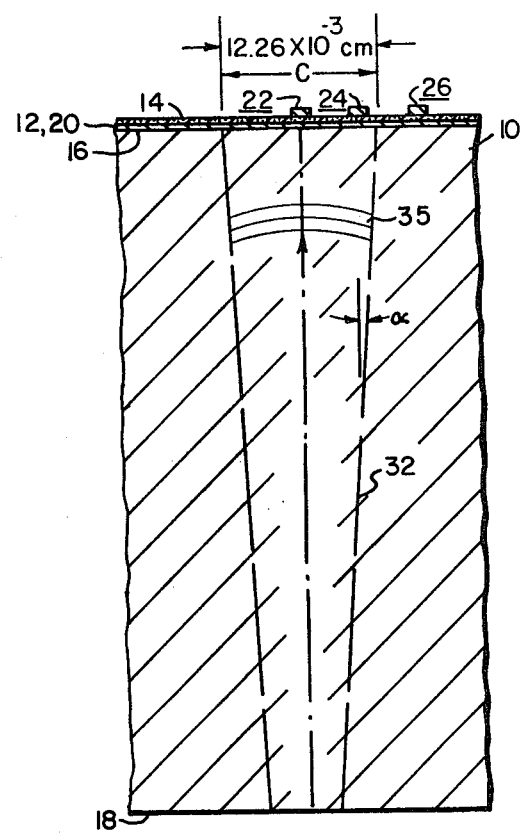

In operation transducer 22 generates an ultrasonic elastic wave or bulk acoustic wave which enters substrate 10 and propagates towards the lower surface 18 as shown in FIG. 2A. The bulk acoustic wave begins to spread at an angle $\alpha$ after passing into the Fraunhofer region. The outlines of the bulk acoustic wave or ultrasonic elastic wave are shown by the dotted lines 32. The wave front is curved in the Fraunhofer field region having a radius of curvature extending from transducer 22 to the position of the wave front. After the ultrasonic elastic wave traverses substrate 10 having a thickness $t$, the ultrasonic wave is reflected back towards the upper surface 16 and continues to spread at the same angle $\alpha$ as shown in FIG. 2B. When the wave arrives at the upper surface 16 the ultrasonic elastic wave will have spread from transducer 22 outwards past transducer 24 by an amount shown by dimension C which, for example, may be $12.26 \times 10^{-3}$ cm. Transducer 26 which is shown in FIG. 2A to be positioned outwards from transducer 22 by dimension B which is outside the incident reflected bulk acoustic wave on upper surface 16. Transducer 24 will convert some of the mechanical acoustic energy to electrical energy and provide an output signal indicative thereof. Transducer 26 will not convert any acoustic wave energy into electrical energy since it is positioned outside the area incident by the first reflected ultrasonic acoustic wave as shown in FIG. 2B. The signal at transducer 24 is the double transit signal since the bulk acoustic wave has traversed substrate 10 two times.

Figure 2C:
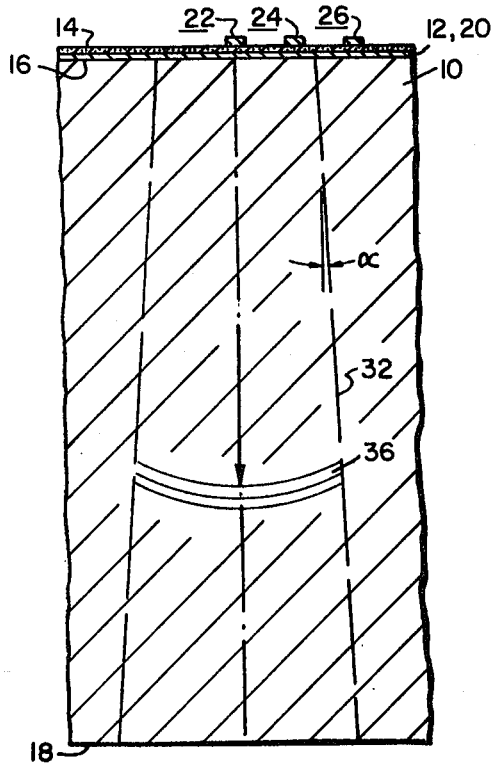
Figure 2D:
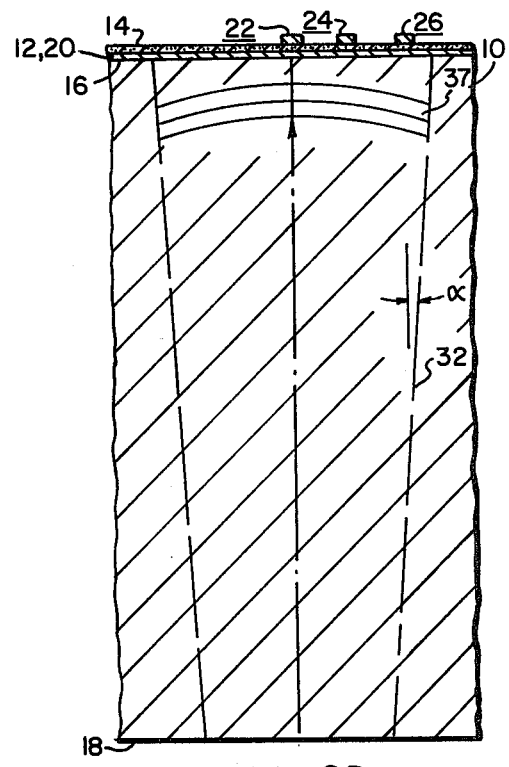

When the bulk acoustic wave shown in FIG. 2B reaches the upper surface 16 the wave is re-reflected back towards the lower surface 18 as shown in FIG. 2C. The beam continues to spread at the angle $\alpha$ as it propagates towards the lower surface 18. When the wave reaches the lower surface 18 it is re-reflected towards the upper surface 16 as shown in FIG. 2D. The wave continues to spread at an angle $\alpha$ as it propagates towards the upper surface. The wave front is not planar but has a radius of curvature as it propagates towards the upper surface 16 as shown by the wave front lines 37 in FIG. 2D. As shown in FIG. 2D wave front 37 will arrive at transducer 24 first and after some delay for further propagation of the wave front, the wave front 37 will arrive at transducer 26. The wave at transducers 24 and 26 will be converted into electrical energy which will be coupled together by electrode 28 shown in FIG. 1. The wave arriving at transducers 24 and 26 in FIG. 2D is known as the quadruple transit signal since the wave has traversed the substrate 10 four times. In traversing the substrate four times the bulk acoustic wave has been reflected twice from the lower surface 18.

The path length for the wave from transducer 22 to transducer 24 after traversing substrate 10 four times may be geometrically determined by drawing a line representing the path of the wave front from the first transducer 22 to the second transducer 24 after four traversals across substrate 10. Likewise the path length for the wave front to transducer 26 from the first transducer 22 may be measured geometrically by tracing out the path of the wave front which will traverse the substrate four times and impinge upon transducer 26. Alternatively it may be seen that the radius of curvature of wave front such as shown by 37 will reach transducer 24 sooner than the wave front will reach transducer 26 representing a delay in arrival which is caused by the increased path length to transducer 26. As can be seen the outer limits of elastic wave 32 encompass the second transducer 24 and the third transducer 26 when the wave reaches the upper surface 16 after traversing substrate 10 four times. The quadruple transit response will be attenuated due to the phase difference of the received bulk acoustic wave at transducers 24 and 26 due to different acoustical path lengths from transducer 22. For example, if the difference in acoustical path lengths to transducer 24 and to transducer 26 for the quadruple transit signal is $\lambda/2$, then the received signal at transducer 24 and transducer 26 will be 180° out-of-phase and will cancel completely if the amplitude of the received signals are the same.

The amplitude of the received signals may be controlled by the area of transducer 24 and the area transducer 26. If the transducers have the same electrical conversion characteristics and the area is the same for each transducer then the electrical amplitude should be the same for the quadruple transit signal. The ultrasonic elastic wave 32 after four traversals will be reflected from surface 16 to the lower surface 18. The wave will continue to be reflected from the upper and lower surfaces back and forth until the ultrasonic elastic wave energy is dissipated due to propagation through substrate 10 and absorption by acoustical absorbing material placed on appropriate areas on the upper and lower surface which is not shown. In addition, subsequent reflections of the bulk acoustic wave 32 will continue to be attenuated due to the spreading or diffraction of the ultrasonic wave at an angle α which will place less energy per unit area due to the cross section enlargement of the wave. However, in practice the quadruple transit time signal is the primary signal which needs to be attenuated since if the quadruple transit signal is attenuated satisfactorily, the remaining reflections will also be attenuated satisfactorily since the signals will be less than the quadruple transit signal.

Figure 3:
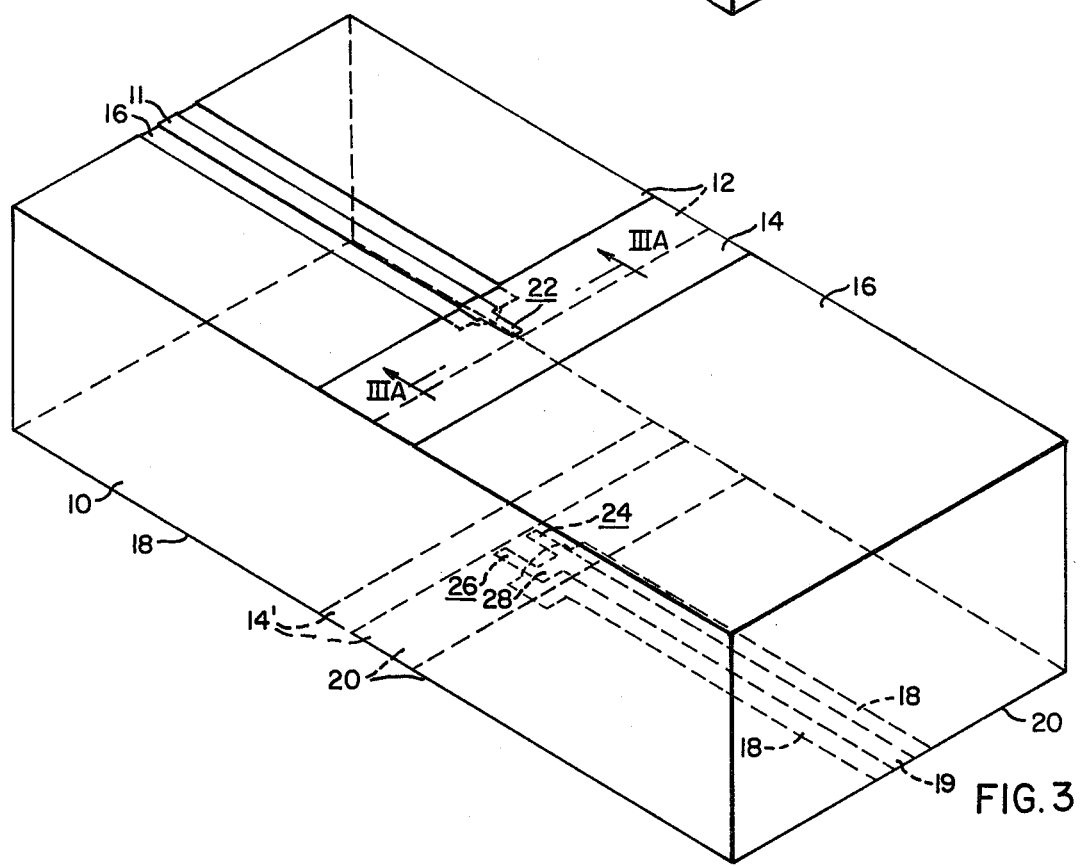
FIG. 3 is an isometric view of an alternate embodiment of the invention.
Figure 3A:
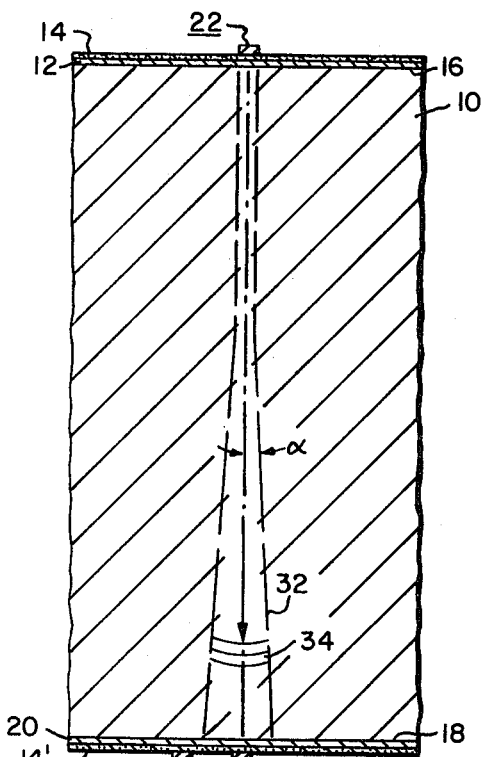
FIGS. 3A through 3C are an enlarged sectional view along the lines IIIA—IIIA of FIG. 3 with additional lines to illustrate the path of an ultrasonic elastic wave from a transducer.
Figure 3B:
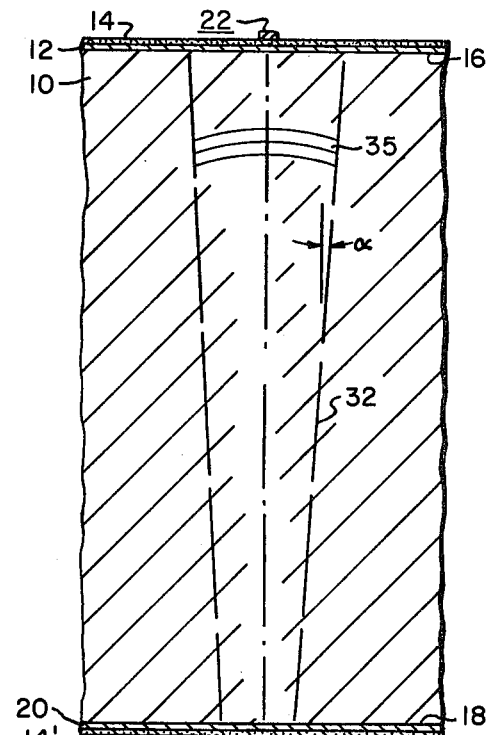
Figure 3C:
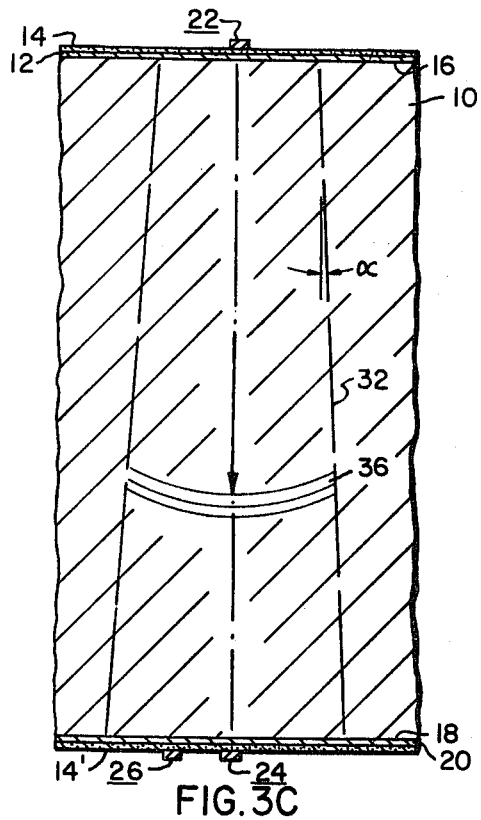

FIG. 3 is an isometric view of an alternate embodiment of the invention. FIGS. 3A through 3C are an enlarged sectional view along the lines IIIA—IIIA of FIG. 3. Transducers 24 and 26 are now located on the lower surface 18. In FIGS. 3 and 3A through 3C like references are used for functions corresponding to the apparatus of FIG. 1. Substrate 10 is shown having a first transducer 22 mounted on upper surface 16 for generating bulk acoustic waves toward lower surface 18. The electrode dimensions for the aperture size of transducer 22 is selected to provide a predetermined diffraction in the bulk acoustic waves generated by transducer 22 such as shown by lines 32. Electrodes 11 and 12 provide a means for coupling an input signal to first transducer 22. The second transducer 24 is mounted on the lower surface 18 and positioned for receiving bulk acoustic waves generated by the first transducer 22. A third transducer 26 is mounted on the lower surface 18 and positioned for receiving only bulk acoustic waves which have been reflected from the upper surface 18. In other words, the third transducer 26 is located outside the area on lower surface 15 incident by the bulk acoustic wave generated by transducer 22 during the waves first transversal of substrate 10 as shown in FIG. 3A. The bulk acoustic wave is reflected back from lower surface 18 towards upper surface 16 as shown in FIG. 3B. The bulk acoustic wave is reflected from the upper surface 16 back to the lower surface 18 as shown in FIG. 3C. As the bulk acoustic wave travels through substrate 10 the beam continues to spread an angle α.

When the ultrasonic elastic wave impinges on lower surface 18 for the second time transducers 24 and 26 will convert the bulk acoustic wave energy into electrical signals. The bulk acoustic wave front will have a radius of curvature and the signal will arrive at transducer 24 at a different time than at third transducer 26 depending upon the relative positions of the transducers. Transducers 26 and 24 may be coupled together such as by electrode 28 shown in FIG. 1 and coupled from the substrate by means of a suitable transmission line such as shown by electrodes 16 and 19 in FIG. 1 except these are now located on the lower surface 18. If the path length from the first transducer 22 to the second transducer 24 is different from the path length from the first transducer 22 to the third transducer 26 then the bulk acoustic wave will arrive at the two transducers at two different times. If the path length difference is λ/2, then the electrical signal generated by transducer 24 will be 180° out-of-phase of the signal generated by transducer 26.

If the amplitude of the two signals at transducers 24 and 26 are the same, then the triple transit signal will be completely attenuated due to the phase difference of two equal amplitude signals. The amplitude of the signals of transducers 24 and 26 may be controlled by adjusting the area or size of the transducers. The triple transit signal deisgnation or term is used since the bulk acoustic wave will traverse the substrate three times before arriving at both transducers 24 and 26. The output of transducers 24 and 26 coupled together will therefore provide an output signal after a first traversal of the bulk acoustic wave from transducer 22 and an attenuated output signal after the third traversal of the bulk acoustic wave across substrate 10 from transducer 22.

Figure 4:
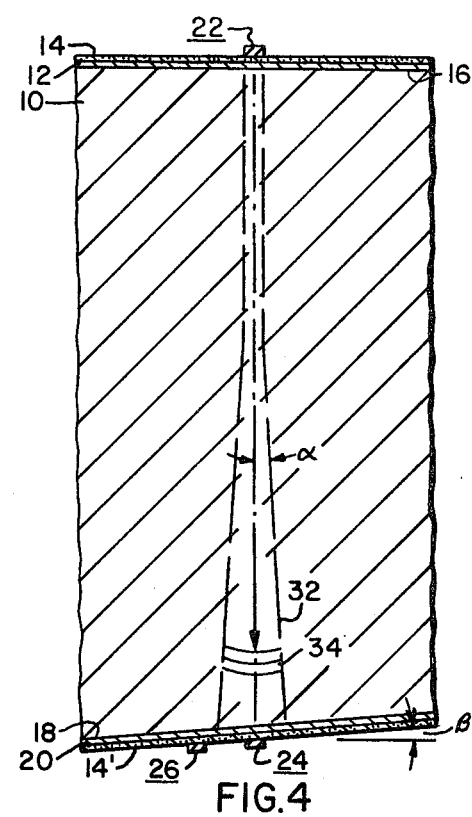
FIG. 4 is an enlarged sectional view of an alternate embodiment of the invention shown in FIG. 3A.

FIG. 4 is an enlarged sectional view of an alternate embodiment of the invention shown in FIG. 3A. In FIG. 4 like references are used for functions corresponding to the apparatus to FIG. 3A. In FIG. 4 lower surface 18 is at an acute angle with respect to the upper surface 16. The result is to reflect bulk acoustic waves generated by transducer 22 at a slight angle from lower surface 18 towards the upper surface 16 so that, in turn, the upper surface 16 will reflect the ultrasonic elastic waves towards transducers 26 and 24. By having lower surface 18 at an acute angle the entire spreading of ultrasonic elastic wave 32 due to diffraction may be better utilized. In addition, since transducer 26 is positioned further away from transducer 22 than transducer 24 the acute angle may facilitate providing an additional path length to the ultrasonic elastic wave 32 arriving at transducer 26.

Figure 5:
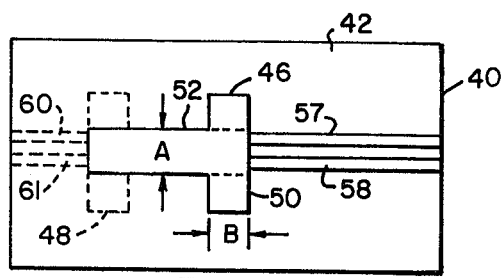
FIG. 5 is a top view of an alternate embodiment of the invention with segmented transducer geometry.
Figure 6A:
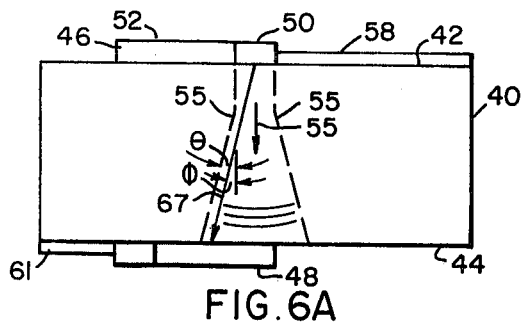
FIGS. 6A through 6C are a front view of the embodiment of FIG. 5 with additional lines to illustrate the path of an ultrasonic wave from one of the segments of the transducer.
Figure 6B:
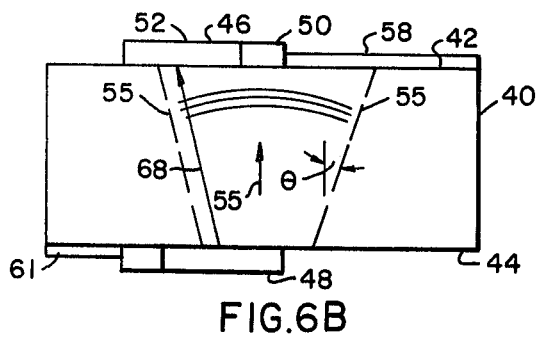
Figure 6C:
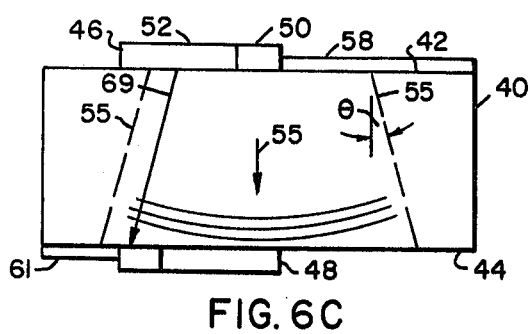

FIG. 5 is a top view of an alterate embodiment of the invention. In FIG. 5, substrate 40 has a first surface 42. Substrate 40 is comprised of material suitable for propagating bulk acoustic waves. A first transducer 46 is mounted on the first surface 42 for generating bulk acoustic waves towards a second surface 44 which is shown in FIGS. 6A through 6C. FIG. 6A through 6C show a front view of the embodiment of FIG. 5 with additional lines to illustrate the lines of an ultrasonic wave from one of the segments of transducer 46.

As shown in FIG. 5 first transducer 46 is comprised of two rectangular segments 50 and 52. The two segments may be fabricated at the same time and may be physically joined as shown in FIG. 5. Segment 52, for example, may be 3½ thousandths of an inch long and one-half thousandths inch wide and segment 50 may be about two thousandths of an inch long and about one-half thousandths inch wide. Segment 52 may be considered to have an aperture dimension equal to its width shown in FIG. 5 as dimension A. Segment 52 generates a bulk acoustic wave which exhibits defraction outwards in the same direction as dimension A. Segment 50 may be considered to have an aperture of dimension B and will generate bulk acoustic waves which exhibits defraction outwards away from segment 50 in the same direction as dimension B. The bulk acoustic wave from segment 50 of first transducer 46 is shown in FIG. 6A. The outer limits of the bulk acoustic wave is shown by the lines 55. The resultant bulk acoustic wave from segments 52 and 50 of the first transducer 46 results in a pattern which has predetermined defraction and propagates towards the lower surface 44. Electrodes 57 and 58 (FIG. 5) provide a means for coupling an input signal to the first transducer 46. The first surface 42 and second surface 44 are planar and positioned to reflect ultrasonic elastic wave energy incident thereon. A second transducer is mounted on the second surface 44 having first selected areas positioned to receive direct and reflected bulk acoustic waves and second selected areas positioned to receive only reflected bulk acoustic waves. In addition, the second selected areas are positioned to provide an additional acoustical path length to the reflected bulk acoustic wave to provide a phase difference in the reflected bulk acoustic wave received at the first and second selected areas of the second transducer. Electrodes 60 and 61 function to couple an output signal from second transducer 48.

In operation, first transducer 46 generates a bulk acoustic wave towards lower surface 44. The ultrasonic wave generated by first segment 50 which is a portion of the total ultrasonic acoustic wave generated by first transducer 46 is shown as ultrasonic wave 55 in FIG. 6A. Ultrasonic wave 55 is in the Fraunhofer field region which exhibits beam spreading at an angle $\theta$ as shown in FIG. 6A according to the defined relationship:

$$\theta = \lambda/2B \quad (5)$$

where $\lambda$ is a wavelength of the ultrasonic elastic wave in the transmission medium and B is the width of segment 50 as shown in FIG. 5. Segment 52 of transducer 46 also generates an ultrasonic acoustic wave which is not shown in FIGS. 6A through 6C. The ultrasonic wave from second segment 52 propagates towards lower surface 44 and intercepts a major portion of second transducer 48. When ultrasonic wave 55 reaches the second surface 44 some of the energy is absorbed by transducer 48 while the remaining energy in ultrasonic wave 55 is reflected up towards first surface 42 as shown in FIG. 6B. When ultrasonic wave 55 reaches first surface 42 it is re-reflected towards second surface 44 as shown in FIG. 6C. Ultrasonic wave 55 continues to spread at an angle $\theta$ during its propagation in substrate 40 as shown in FIGS. 6B and 6C.

Figure 7:
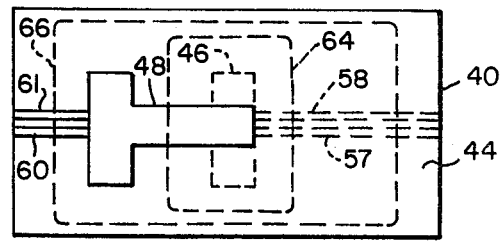
FIG. 7 is a bottom view of the alternate embodiment of the invention shown in FIG. 5.

FIG. 7 is a bottom view of the alternate embodiment of the invention shown in FIG. 5. The outline of the ultrasonic wave 55 as it impinges upon the second surface 44 as shown in FIG. 6A is shown by the line 64 in FIG. 7. The outline of the ultrasonic wave 55 after it has traversed substrate 40 three times and impinges upon second surface 44 as shown in FIG. 6C is shown by line 66 in FIG. 7.

Figure 8:
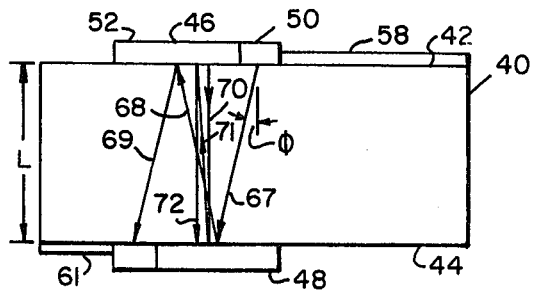
FIG. 8 shows a front view of the embodiment of FIG. 5 with additional lines to illustrate the two paths of an ultrasonic wave from two segments of a transducer.

FIG. 8 shows a front view of the embodiment of FIG. 5 where additional lines illustrate the path and ultrasonic wave. In FIG. 8 line segments 67 through 69 illustrate the path of an ultrasonic wave from first segment 50 to second transducer 48 after traversing substrate 40 three times. Line segment 67 is also shown in FIG. 6A representing that portion of ultrasonic wave 55 traveling in the direction of line 67. Line 68 is shown in FIG. 6B representing that portion of ultrasonic wave 55 traveling in the direction of line 68. Line 69 is shown in FIG. C representing that portion of ultrasonic wave 55 traveling in the direction of line 69 to reach second selected areas of second transducer 48. Lines 70, 71 and 72 represent the direct path of an ultrasonic wave such as one from second segment 52 which traverses substrate 40 three times and impinges upon second transducer 48. The ultrasonic path length of lines 70, 71 and 72 are merely three times the spacing L between first surface 42 and second surface 44. The path length of lines 67, 68 and 69 is longer than the path length of lines 70, 71 and 72 which is a function of the distance L and the angle $\phi$. Using the realtionship cos $\phi = L/(L + \Delta L)$ then $\Delta L = L(1-\cos \phi)/ \cos \phi$. Line 67 is therefore longer than line 70 by the length $\Delta L$. The total path length of line 67, 68, 69 is therefore $3L + 3\Delta L$. Setting $3\Delta L$ equal to $\lambda/2$ of the ultrasonic wave generated by first transducer 46, destructive interference will occur between the wave energy received at second transducer 48 via line 69 at second selected areas and line 72 at first selected areas.

Figure 9A:
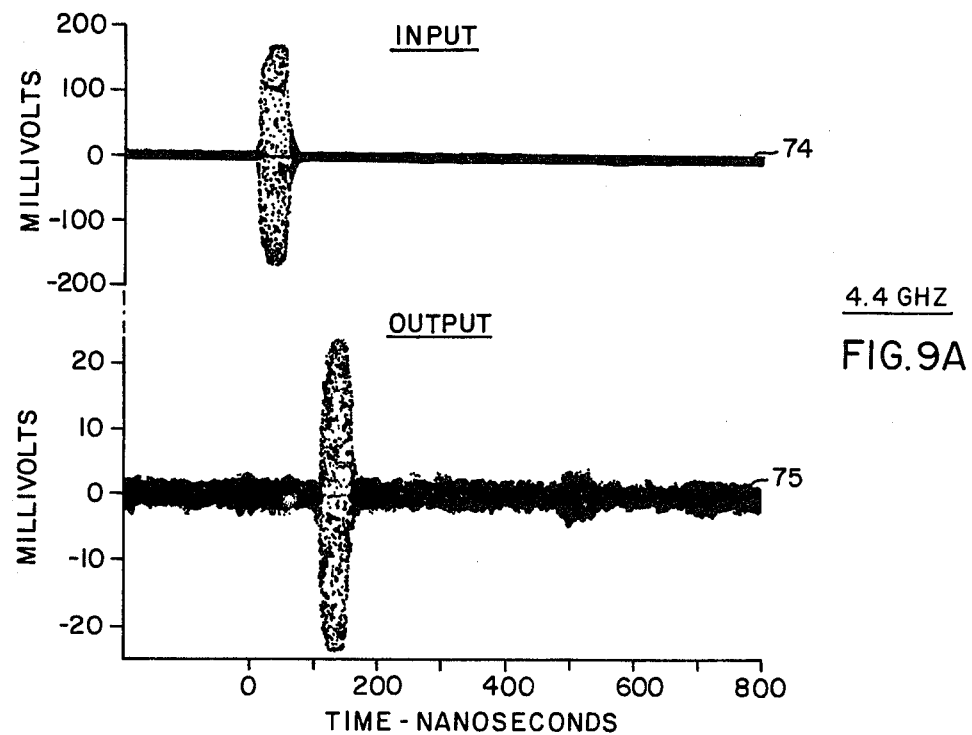
FIGS. 9A and 9B show curves of typical waveforms at the input and output terminals of the embodiment of FIG. 5.
Figure 9B:
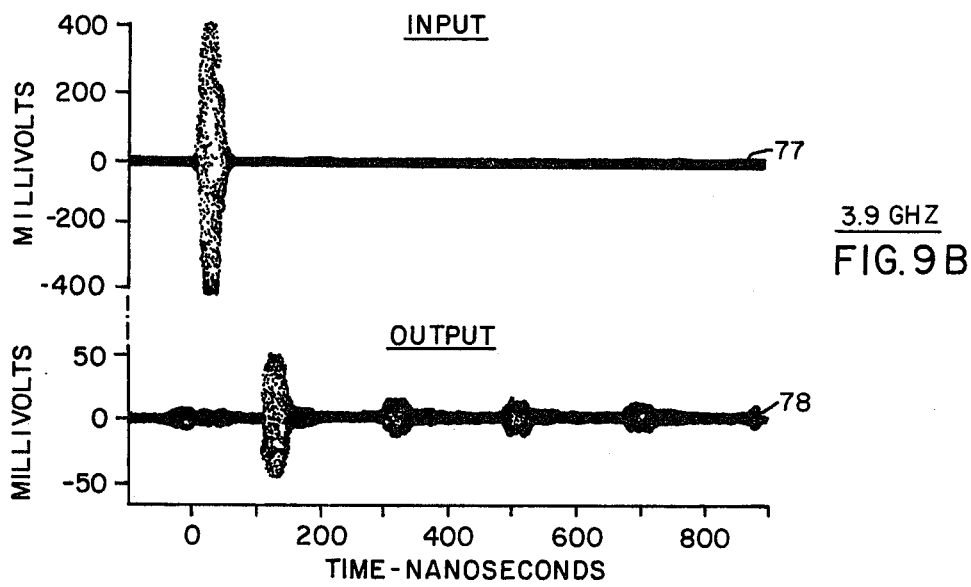

FIG. 9A and 9B shows curves of typical waveforms at the input and output terminals of the embodiment of FIG. 5. In FIG. 9A curve 74 shows an input signal to first transducer 46 over electrodes 58 and 57. Curve 74 is a sine wave for a fixed pulse duration of approximately 60 nanoseconds at a frequency of 4.4 GHz. In FIG. 9A, for curve 74, the ordinate represents millivolts and the abscissa represents time in nanoseconds. The input signal to transducer 46 causes transducer 46 to generate an ultrasonic acoustic wave 55 as shown in FIG. 6A. Curve 75 represents the output of transducer 48 along electrodes 60 and 61 which is generated from the incident ultrasonic wave 55 as it impinges transducer 48. Curve 75 shows an output signal approximately 100 nanoseconds after the start of the input signal and having a pulse duration of approximately 60 nanoseconds in a frequency of 4.4 GHz. In FIG. 9A, for curve 75, the ordinate represents millivolts and the abscissa represents time in nanoseconds. If it took the input pulse 100 nanoseconds to traverse substrate 40, then the triple transit signal should show up in curve 75 after three transversals of the ultrasonic wave or 300 nanoseconds after the input signal (curve 74). Curve 75, however, does not show an output pulse after 300 nanoseconds or at the time of 300 to 400 nanoseconds due to destructive interference of the received ultrasonic wave after it has traversed substrate 40 three times. The triple transit signal is believed to be suppressed between $-25$ to $-30$ dB below the first output pulse which occurs after 100 nanoseconds. Curve 75 shows a slight output for the fifth and seventh transit across substrate 40 occurring at 500 and 700 nanoseconds respectively.

In FIG. 9B curve 77 shows an input voltage to first transducer 46 by means of electrodes 57 and 58. The input signal is a pulse having a duration of approximately 60 nanoseconds and a sine wave frequency of about 3.9. GHz. Curve 78 shows the output of transducer 48 over electrodes 60 and 61. In FIG. 9B, for curves 77 and 78, the ordinate represents millivolts and the abscissa represents time in nanoseconds. The input pulse of curve 77 causes transducer 46 to generate an ultrasonic wave which propagates towards transducer 48 as shown in FIG. 6A. When the ultrasonic wave reaches transducer 48 an output pulse is generated which is shown on curve 78 delayed by approximately 100 nanoseconds from the input pulse. The ultrasonic wave traverses twice more across substrate 40 to produce a signal at transducer 48 which is attenuated due to propagation through substrate 40 and due to destructive interference of the ultrasonic wave which reaches transducer 48 due to different path lengths taken by the acoustic wave to first and second selected areas of transducer 48. The ultrasonic wave traverses substrate 40 twice again and returns to transducer 48 to generate a fifth transit signal shown at approximately 500 nanaseconds. The ultrasonic wave traverses substrate 40 twice again to generate a seventh transit signal at approximately 700 nanoseconds. The out-of-phase cancellation of the triple transit signal as shown in FIGS. 9A and 9B is observed over a frequency range exceeding 1 GHz.

The characteristics of the device in FIG. 5 changes over frequency due to the fact that the physical positions of the transducers determine various path lengths for the triple transit case and the frequency of the input signal determines the spreading angle $\theta$ of the ultrasonic wave emitted by transducer 46. As the frequency is lowered, the defraction angle θ from transducer 46 increases since the wavelength increases according to the relationship $\theta = \lambda/2d$ where $d$ is the transducer aperture. Thus, as the frequency is lowered the ultrasonic beam spreads outwards and the area incident on the second surface 44 during the first transit is increased. The area incident on the second surface 44 upon the third transit of the acoustic wave is likewise increased since the ultrasonic wave continues to spread at the angle θ. Therefore, geometric sizing of the apertures of the transmitting transducer such as segments 52 and 50 can assure that the ultrasonic wave impinging upon the receiving transducer 48 on the third transit across substrate 40 provides destructive interference due to the shape and positioning of receiving transducer 48 for any predetermined frequency.

The invention provides a means for delaying signals comprising a substrate having an upper and lower surface, the substrate comprising material suitable for propagating bulk acoustic waves, a first transducer mounted on the upper surface for generating bulk acoustic waves toward the lower surface, the first transducer electrode dimensions being of such size to provide a predetermined defraction in the bulk acoustic waves, the lower surface being planar and positioned to reflect the bulk acoustic waves incident upon the lower surface, means for coupling an input signal to the first transducer, a second transducer mounted on the upper surface and positioned for receiving bulk acoustic waves reflected from the lower surface and having a first acoustical path length from the first transducer to the second transducer for bulk acoustic wave reflected twice from the lower surface, a third transducer mounted on the upper surface and positioned for receiving only bulk acoustic waves reflected two or more times from the lower surface and spaced from the first transducer to provide a second acoustical path length from the first transducer to the third transducer for a bulk acoustic wave reflected twice from the lower surface, the first and second acoustical path lengths being different to provide a phase difference of the bulk acoustic wave reflected two times from the lower surface and received at the second and third transducer, and means for electrically coupling the second and third transducers to provide an output signal having a double transit response and an attenuated quadruple transit response due to the phase difference of the received bulk acoustic wave.

Alternate configurations are provided where the second and third transducer are mounted on the lower surface. Another alternate configuration provides for one composite transducer on the lower surface in place of the second and third transducers wherein first selected areas are positioned to receive direct and reflected bulk acoustic waves and second selected areas are positioned to receive only reflected bulk acoustic waves.

I claim:

1. Electroacoustic apparatus for delaying signals comprising:
   a substrate having an upper and lower surface,
   said substrate comprised of material suitable for propagating bulk acoustic waves,
   a first transducer mounted on said upper surface for generating bulk acoustic waves toward said lower surface,
   said first transducer electrode dimensions being of such size to provide a predetermined diffraction in said bulk acoustic waves,
   said lower surface being planar and positioned to reflect the bulk acoustic waves incident upon said lower surface;
   means for coupling an input signal to said first transducer,
   a second transducer mounted on said upper surface and positioned for receiving bulk acoustic waves reflected from said lower surface and having a first acoustical path length from said first transducer to said second transducer for a bulk acoustic wave reflected twice from said lower surface,
   a third transducer mounted on said upper surface and positioned for receiving only bulk acoustic waves reflected two or more times from said lower surface and spaced from said first transducer to provide a second acoustical path length from said first transducer to said third transducer for a bulk acoustic wave reflected twice from said lower surface,
   said first and second acoustical path lengths being different to provide a phase difference of the bulk acoustic wave reflected two times from said lower surface and received at said second and third transducer, and
   means for electrically coupling said second and third transducers to provide an output signal having a double transit response and an attenuated quadruple transit response due to the phase difference of the received bulk acoustic wave.

2. Electroacoustic apparatus comprising:
   a substrate having upper and lower surface,
   said substrate comprised of material suitable for propagating bulk acoustic waves,
   a first transducer mounted on said upper surface for generating bulk acoustic waves toward said lower surface,
   said first transducer electrode dimensions being of such size to provide a predetermined diffraction in said bulk acoustic waves,
   said upper and lower surfaces being planar and positioned to reflect ultrasonic elastic wave energy incident thereon,
   means for coupling an input signal to said first transducer,
   a second transducer mounted on said lower surface and positioned for receiving bulk acoustic waves from said first transducer and having a first acoustical path length from said first transducer to second transducer for a bulk acoustic wave reflected once from said upper surface,
   a third transducer mounted on said lower surface and positioned for receiving only bulk acoustic waves reflected from said upper surface and spaced from said second transducer to provide a second acoustical path length from said first transducer to said third transducer for a bulk acoustic wave reflected once from said upper surface,
   said first and second acoustical path lengths being different to provide a phase difference of the bulk acoustic wave reflected from said upper surface and received at said second and third transducer, and
   means for electrically coupling said second and third transducers to provide an output signal having a first transit response and an attenuated triple transit response due to the phase difference of the received bulk acoustic wave.

3. The apparatus of claim 2 wherein said upper and lower surfaces are parallel.

4. The apparatus of claim 2 wherein said upper and lower surfaces are at an acute angle.

5. Electroacoustic apparatus comprising:
a substrate having a first and second surface,
said substrate comprised of material suitable for propagating bulk acoustic waves,
a first transducer mounted on said first surface for generating a first bulk acoustic wave toward said second surface,
said first transducer electrode dimensions being of such size to provide a predetermined diffraction in said bulk acoustic waves,
said first and second surfaces being planar and positioned to reflect ultrasonic elastic wave energy incident thereon,
means for coupling an input signal to said first transducer,
a second transducer mounted on said second surface having first selected areas positioned to receive direct and reflected bulk acoustic waves and second selected areas positioned to receive only reflected bulk acoustic waves and also positioned to provide an additional acoustic path length due to diffraction to the reflected bulk acoustic wave to provide a phase difference in the reflected bulk acoustic wave received at the first and second selected areas of said second transducer, and
means for coupling an output signal from said second transducer.

6. Electroacoustic apparatus comprising:
a substrate having a first and second surface,
said substrate comprised of material suitable for propagating bulk acoustic waves,
a first transducer mounted on said first surface for generating a first bulk acoustic wave toward said second surface,
said first transducer electrode dimensions being of such size to provide a predetermined diffraction in said bulk acoustic waves,
said first and second surfaces being planar and positioned to reflect ultrasonic eleastic wave energy incident thereon,
means for coupling an input signal to said first transducer,
a second transducer mounted on said second surface having first selected areas positioned to receive said first bulk acoustic waves,
said first bulk acoustic wave reflected from said second surface towards said first surface to form a first reflected bulk acoustic wave,
said first reflected bulk acoustic wave reflected from said first surface back towards said second surface to form a second reflected bulk acoustic wave,
said second transducer including second selected areas positioned to receive a portion of said second reflected bulk acoustic waves having traveled a first acoustic path length and third selected areas positioned to receive a portion of said second reflected bulk acoustic wave having traveled a second acoustic path length due to diffraction to provide a phase difference in the received second reflected bulk acoustic wave, and
means for coupling an output signal from said second transducer.

* * * * *